(12) United States Patent
Beer et al.

(10) Patent No.: US 6,612,738 B2
(45) Date of Patent: Sep. 2, 2003

(54) METHOD FOR DETERMINING THE TEMPERATURE OF A SEMICONDUCTOR CHIP AND SEMICONDUCTOR CHIP WITH TEMPERATURE MEASURING CONFIGURATION

(75) Inventors: Peter Beer, München (DE); Manfred Dobler, München (DE); Gunnar Krause, München (DE)

(73) Assignee: Infineon Technologies, Munich (DE)

( * ) Notice: Subject to any disclaimer, the term of this patent is extended or adjusted under 35 U.S.C. 154(b) by 0 days.

(21) Appl. No.: 09/801,963

(22) Filed: Mar. 8, 2001

(65) Prior Publication Data

US 2001/0026576 A1 Oct. 4, 2001

(30) Foreign Application Priority Data

Mar. 8, 2000 (DE) .......................... 100 11 179

(51) Int. Cl.[7] ................................................ G01K 7/01
(52) U.S. Cl. ...................................... 374/183; 374/178
(58) Field of Search .................................. 374/178, 183

(56) References Cited

U.S. PATENT DOCUMENTS

| 3,158,027 | A | * | 11/1964 | Kibler ..................... 331/107 T |
| 3,440,883 | A | * | 4/1969 | Lightner ..................... 257/470 |
| 4,476,357 | A | * | 10/1984 | Malmborg et al. .......... 200/241 |
| 4,726,226 | A | * | 2/1988 | Tellerman ..................... 73/292 |
| 4,847,794 | A | * | 7/1989 | Hrubes ........................ 702/86 |
| 5,024,535 | A | * | 6/1991 | Winston, Jr. ................ 327/512 |
| 5,844,208 | A | * | 12/1998 | Tustaniwskyj et al. .... 165/80.2 |
| 5,918,982 | A | * | 7/1999 | Nagata et al. .............. 374/178 |
| 5,961,215 | A | * | 10/1999 | Lee et al. ................... 374/178 |
| 6,149,299 | A | * | 11/2000 | Aslan et al. ................ 257/470 |

* cited by examiner

Primary Examiner—Diego Gutierrez
Assistant Examiner—Lydia M. De Jesús
(74) Attorney, Agent, or Firm—Laurence A. Greenberg; Werner H. Stemer; Gregory L. Mayback

(57) ABSTRACT

In order to be able to determine precisely a temperature of a semiconductor chip, in particular a semiconductor memory, during active operation, a temperature-dependent diode structure of the chip is connected to four chip terminals using four-conductor connection technology. In this manner, an inexpensive and accurate measuring mechanism is provided for measuring the temperature.

5 Claims, 2 Drawing Sheets

METHOD FOR DETERMINING THE TEMPERATURE OF A SEMICONDUCTOR CHIP AND SEMICONDUCTOR CHIP WITH TEMPERATURE MEASURING CONFIGURATION

BACKGROUND OF THE INVENTION

Field of the Invention

The present invention relates to a method for determining the temperature of a semiconductor chip, and to a semiconductor chip with a temperature measuring configuration.

As storage densities are progressively increasing, chip areas are continuously being reduced and operating frequencies are continuously being raised. As a result, the energy density introduced into the semiconductor material is increasing. A considerable power loss is generated during the operation of the chip, for example of a DRAM and a SDRAM. This causes the chips to heat up to a temperature that may be considerably higher than the ambient temperature. However, the behavior of the chip module is adversely affected by excessively high temperatures. Therefore, quantitative knowledge of the semiconductor chip temperature is of interest for various reasons. There is therefore a need to determine it. However, this is known to be difficult using conventional methods for temperature measurement, i.e. temperature measurements using temperature sensors, in particular if the measurement is to be carried out on a semiconductor chip which is being operated according to regulations, i.e. is accommodated in a housing and is being operated in a specific circuit.

Published, Non-Prosecuted German patent application DE 196 52 046 A1 discloses a method for determining the temperature of a semiconductor chip in which the following method steps are described. Selected chip terminals have voltages applied to them, or currents impressed on them. The polarity and/or dimensioning of the voltages or currents is such that the current flow which occurs and/or the voltage which occurs is at least partially determined by a diode provided between the selected chip terminals or a structure which acts as a diode. The voltage and current values that occur are determined and the temperature of the semiconductor chip is determined by reference to the determined voltage and current values using a current/voltage temperature relationship that has been previously determined for the semiconductor chip or semiconductor chip type which is to be investigated. Here, use is made of the known effect that the current flowing across a pn-type junction or through a diode (with a permanently set voltage) or the voltage which occurs at the diode (with an impressed current) depends on the temperature of the diode or its pn-type junction. This dependence makes it possible to determine, from the voltage applied to the selected diode and the current flowing through it, the temperature of the diode in a precise way. The diodes that are used for the measurement do not need to be specifically provided for this purpose, but may also be present in any case on the semiconductor chip. Such diodes are, for example, overvoltage protection diodes or polarity-reversal protection diodes. Structures which act as diodes may alternatively or additionally be used as the temperature measuring diodes. Such structures are generated automatically if the semiconductor chip substrate is provided with wells with different doping.

In order to standardize the temperature measuring configuration integrated onto the chip, the chip or chip type which is to be investigated must have been previously characterized in terms of the currents flowing, or voltages occurring, at the various chip temperatures. To do this, for example, measurements of currents or voltages that occur are carried out on the semiconductor chip that has been successively heated through an external source to predefined temperatures. The chip that is to be characterized is first placed in a temperature-controlled measuring space and placed at a defined temperature in the non-operative state. At a time at which it can be assumed that the semiconductor chip has reached a defined temperature, the semiconductor chip is activated in such a way that either the diode or the diode is switched on. The voltage applied to the input signal terminal and the current which consequently flows via the input signal terminal or the current which is impressed on the input signal terminal and the voltage which occurs as a result of this are determined and assigned to the defined temperature. If this measuring and assignment process is repeated for various temperatures, a current/voltage temperature characteristic curve is obtained, from which the chip temperature can be precisely determined later by reference to measured current and/or voltage values. It is generally favorable here if the power loss generated by the temperature measurement in the semiconductor chip is kept as low as possible. If the semiconductor chip continues to be operated normally during the temperature measurement, it also proves advantageous if the semiconductor chip is operated during the temperature measurement in such a way that the occurrence of power losses which may change the temperature which is actually to be measured is restricted as far as possible.

If the semiconductor chip temperature is to be measured at a given time during the "normal" operation, it is necessary, during normal operation, to apply a voltage to, or impress a current on, the input signal terminal. The polarity and dimensioning of the voltage or current are such that one of the diodes is thus placed in the conductive state and the current or voltage that occurs is determined by the diode which has been switched on. The voltage and current values that occur in this process are, as described above, used for determining the temperature. The semiconductor chip terminal which is selected as the input signal terminal is preferably one which can have a measuring voltage applied to it, or a measuring current impressed on it, without having to disrupt or interrupt the "normal" operation of the semiconductor chip.

Furthermore, the manual titled "Elektrische Messtechnik [Electrical Measuring Technology]", by E. Schrüfer, Carl Hanser Verlag [Publishing House], Munich Vienna, 1983, discloses a method for measuring small ohmic resistances. Here, a known current is impressed on a resistor and a voltage dropping across the resistor is measured. The contact resistances that occur at the terminals when measuring very small resistances should not be neglected. In order to avoid including them in the measurement, four-conductor connection technology is used. Here, the terminals and of the power supply circuit are separated from the potential terminals of the measuring line. The possible voltage drops at the connecting points are not measured. The contact resistances at the terminals are in series with the input resistance of voltage meter and can be ignored, as can the resistances of the measuring lines, as long as the voltage meter has sufficiently high impedance.

SUMMARY OF THE INVENTION

It is accordingly an object of the invention to provide a method for determining the temperature of a semiconductor chip and a semiconductor chip with temperature measuring configuration which overcome the above-mentioned disadvantages of the prior art devices and methods of this general type, in which the temperature can be determined easily and with a high precision.

With the foregoing and other objects in view there is provided, in accordance with the invention, a method for determining a temperature of a semiconductor chip. The method includes the steps of impressing a defined current onto selected chip terminals, and measuring a voltage occurring at least partially at a semiconductor diode structure disposed between the selected chip terminals using four-conductor connection technology, the voltage being tapped off directly at the semiconductor diode structure. The temperature of the semiconductor chip is determined by reference to the voltage and the defined current.

The temperature measuring circuit with which the actual chip temperature can be determined precisely during the normal or active operation of the chip by four-conductor measuring technology is processed on the chip. The voltage fluctuations brought about during the active operation, for example owing to ground bounces, cause measuring errors that are negligible according to the invention. The measuring circuit according to the invention can be connected into the circuit here either by a test mode and switching transistors or of transfer gates or by a metal option.

Semiconductor switches, which can for example be activated by a control circuit integrated on the chip, are advantageously provided in the connecting lines and/or in the measuring lines of the temperature measuring circuit. In order to feed in the measuring current and to measure the voltage value by an external test configuration for determining the chip temperature during active operation, the temperature measuring configuration of the chip is first activated. To do this, the switches integrated on the chip are closed. As a result, the temperature measuring configuration is accessible externally via the chip measuring terminals. After the temperature measurement has been terminated, these switches can be opened again in order to be able to make available the measuring terminals again for normal use of the chip. The temperature measurement can therefore be carried out at any desired chip on a wafer, or even in a housed chip.

According to one preferred embodiment, the address or input/output terminals of the module which are present in any case, and which are connected to corresponding address or input/output lines, are used as the four diode chip terminals. If the control circuit and the switches are integrated onto the chip, these terminals can be used as address and input/output terminals during normal operation without restricting the use, while in test mode they are temporarily used as measuring terminals for temperature measurement. Chip internal connection pads or fixed voltage potentials may also be used as chip terminals.

With the foregoing and other objects in view there is provided, in accordance with the invention, a semiconductor chip containing a housing, chip terminals extending from the housing, a diode structure having terminals disposed in the housing, two connecting lines each connected between one of the chip terminals and one of the terminals of the diode structure, and two voltage measuring lines each connected between further ones of the chips terminals and the terminals of the diode structure. The connecting lines and the voltage measuring lines connected to the diode structure using four-conductor connection technology.

Other features which are considered as characteristic for the invention are set forth in the appended claims.

Although the invention is illustrated and described herein as embodied in a method for determining the temperature of a semiconductor chip and a semiconductor chip with temperature measuring configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
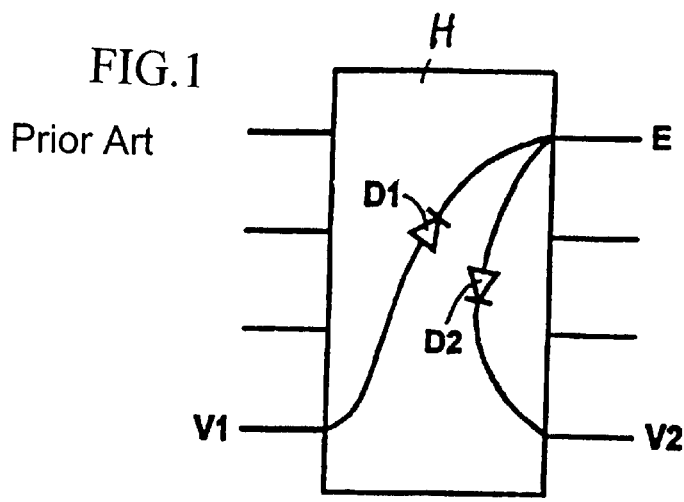
FIG. 1 is a schematic view of a configuration of overvoltage protection diodes or structures which act as such in a semiconductor chip according to the prior art.

In all the figures of the drawing, sub-features and integral parts that correspond to one another bear the same reference symbol in each case. Referring now to the figures of the drawing in detail and first, particularly, to FIG. 1 thereof, there is shown a known method for determining the temperature of a semiconductor chip H. Selected chip terminals E, V1, V2 have voltages applied to them, or currents impressed on them. The polarity and/or dimensioning of the voltages or currents is such that the current flow which occurs and/or the voltage which occurs is at least partially determined by diodes D1, D2 provided between the selected chip terminals or a structure which acts as a diode. The voltage and current values that occur are determined and the temperature of the semiconductor chip H is determined by reference to the determined voltage and current values using a current/voltage temperature relationship which has been previously determined for the semiconductor chip H or semiconductor chip type which is to be investigated. Here, use is made of the known effect that the current flowing across a pn-type junction or through a diode (with a permanently set voltage) or the voltage which occurs at the diode (with an impressed current) depends on the temperature of the diode or its pn-type junction. This dependence makes it possible to determine, from the voltage applied to the selected diode and the current flowing through it, the temperature of the diode in a precise way. The diodes that are used for the measurement do not need to be specifically provided for this purpose, but may also be present in any case on the semiconductor chip H. Such diodes are, for example, overvoltage protection diodes or polarity-reversal protection diodes. Structures which act as diodes may alternatively or additionally be used as the temperature measuring diodes. Such structures are generated automatically if the semiconductor chip substrate is provided with wells with different doping.

In order to standardize the temperature measuring configuration integrated onto the chip, the chip or chip type which is to be investigated must have been previously characterized in terms of the currents flowing, or voltages occurring, at the various chip temperatures. To do this, for example, measurements of currents or voltages that occur are carried out on a semiconductor chip that has been successively heated through an external source to predefined temperatures.

The chip that is to be characterized is first placed in a temperature-controlled measuring space and placed at a defined temperature in the non-operative state. At a time at which it can be assumed that the semiconductor chip has reached a defined temperature, the semiconductor chip H is activated in such a way that either the diode D1 or the diode D2 is switched on. The voltage applied to the input signal terminal E and the current which consequently flows via the input signal terminal E or the current which is impressed on the input signal terminal E and the voltage which occurs as a result of this are determined and assigned to the defined temperature. If the measuring and assignment process is repeated for various temperatures, a current/voltage temperature characteristic curve is obtained, from which the chip temperature can be precisely determined later by reference to measured current and/or voltage values. It is generally favorable here if the power loss generated by the temperature measurement in the semiconductor chip H is kept as low as possible. If the semiconductor chip H continues to be operated normally during the temperature measurement, it also proves advantageous if the semiconductor chip H is operated during the temperature measurement in such a way that the occurrence of power losses which may change the temperature which is actually to be measured is restricted as far as possible.

If the semiconductor chip temperature is to be measured at a given time during the "normal" operation, it is necessary, during normal operation, to apply a voltage to, or impress a current on, the input signal terminal E, the polarity and dimensioning of the voltage or current are such that one of the diodes D1 and D2 is thus placed in the conductive state and the current or voltage which occurs is determined by the diode which has been switched on. The voltage and current values that occur in this process are, as described above, used for determining the temperature. The semiconductor chip terminal which is selected as the input signal terminal E is preferably one which can have a measuring voltage applied to it, or a measuring current impressed on it, without having to disrupt or interrupt the "normal" operation of the semiconductor chip.

Figure 2:
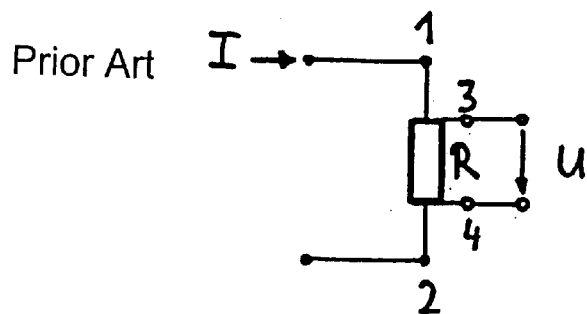
FIG. 2 is a circuit diagram for measuring low impedance resistors using four-conductor technology according to the prior art.

FIG. 2 shows another method for determining the temperature. Here, a known current I is impressed on a resistor R and a voltage U dropping across the resistor R is measured. The contact resistances that occur at the terminals when measuring very small resistances should not be neglected. In order to avoid including them in the measurement, four-conductor connection technology outlined in FIG. 2 is used. Here, terminals 1 and 2 of a power supply circuit are separated from the potential terminals 3 and 4 of the measuring line. The possible voltage drops at the connecting points 1 and 2 are not measured. The contact resistances at the terminals 3 and 4 are in series with an input resistance of voltage meter and can be ignored, as can the resistances of the measuring lines, as long as the voltage meter has sufficiently high impedance.

Figure 3:
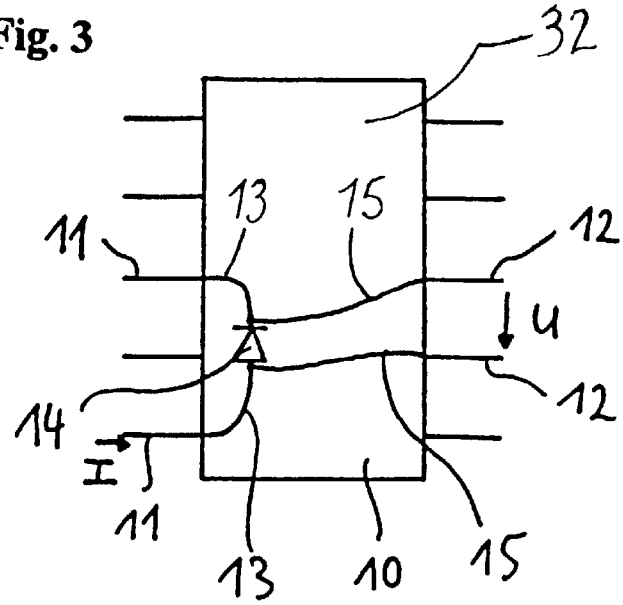
FIG. 3 is a schematic view of the semiconductor chip according to the invention.

According to the invention and as shown in FIG. 3, a semiconductor memory module, for example a dynamic random access memory (DRAM), has a semiconductor chip 10 with numerous chip terminals or pins disposed in a housing 32. In particular, inter alia, numerous address and input/output pins are provided in a known fashion. In each case two of the pins are selected as a first chip terminal pair 11 and as a second chip terminal pair 12 for an integrated temperature measuring configuration of the chip 10. A measuring diode 14 or a suitable semiconductor structure is conductively connected to the pins 11 through two connecting lines 13 of the chip. The measuring diode 14 or the suitable semiconductor structure is conductively connected to the pins 12 via two measuring lines 15. It is to be noted that the voltage measurement is more precise the closer the spatial connection of the two measuring lines 15, in accordance with the four-conductor connection technology described above, to the temperature-dependent semiconductor structure of the pn-type junction or of the measuring diode 14. In order to determine the temperature of the chip 10, a known current I, for example from an external measuring configuration (not shown) is fed in a conducting direction into the measuring diode 14 via the first chip connection pair 11 and a measuring voltage U which occurs at the pn-type junction as a function of the temperature of the measuring diode 14 or of the semiconductor chip 10 is measured at the second chip connection pair 12. The temperature measurement may be carried out here either on the housed individual chip 10 or even beforehand on any desired chip on the wafer.

Figure 4:
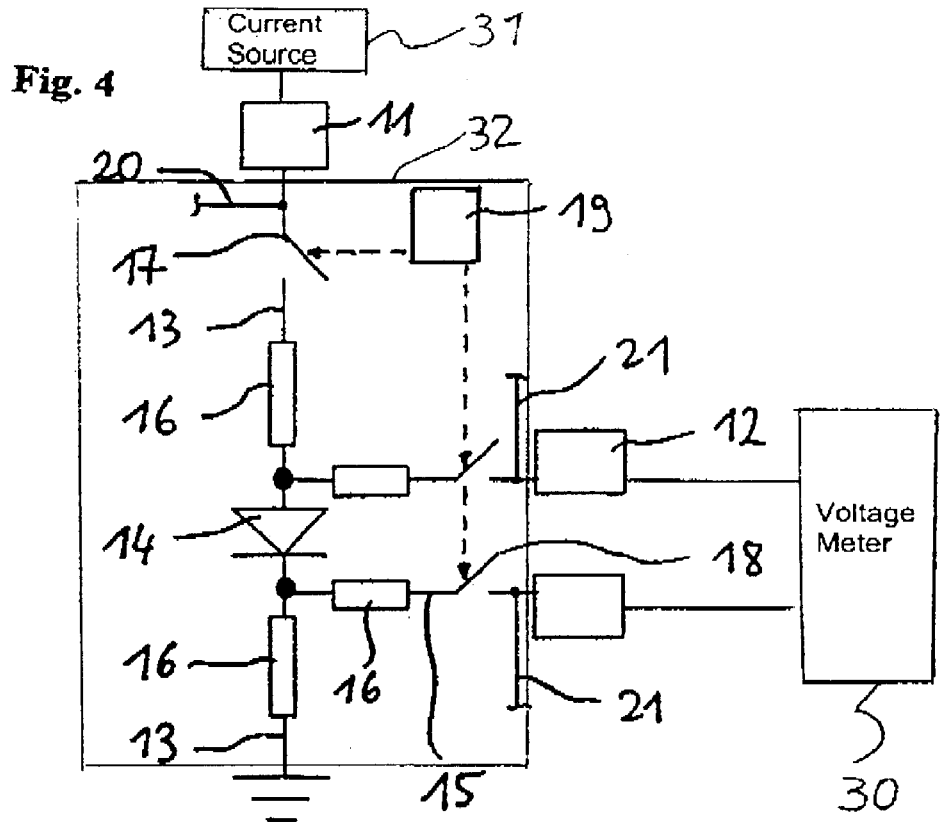
FIG. 4 is a circuit diagram of a temperature measuring configuration of the semiconductor chip according to a first exemplary embodiment of the invention.

FIG. 4 shows a simplified electrical circuit diagram of the temperature measuring configuration in a SDRAM chip according to the first exemplary embodiment, the reference symbols from FIG. 3 having been adopted as far as possible for the sake of simplicity. The integrated measuring diode 14 is connected via the connecting line 13 between the pin 11 and the ground potential of the semiconductor circuit. Here, parasitic resistances 16 act in a known fashion as a function of the conductor geometry and the doping conditions. Furthermore, a low-impedance p-FET is disposed in the current path as a current switch 17 in the connecting line 13 between the pin 11 and the measuring diode 14. The measuring lines 15 are connected as spatially close as possible to the temperature-dependent diode structure 14. This ensures that the parasitic resistance occurring between the voltage connection points of the connecting line 13 and the measuring diode 14 is sufficiently low. In addition, the voltage which occurs at this resistance and which falsifies the voltage measurement is thus also kept low, and thus also the temperature measuring error is kept small. The voltage fluctuations which possibly occur in the parasitic resistances 16 of the connecting lines 13 in the measuring current path are in any case without significance owing to the four-conductor measuring technology. The parasitic resistances 16 of the voltage measuring lines 15 cause a negligible error because a high-impedance voltage measuring device is connected to the voltage measuring pins 12. A voltage switch 18 in the form of a n-FET, or alternatively a transfer gate is disposed in each of the two measuring lines 15. The integrated circuit also has a control circuit 19 which can be actuated by selected pins of the chip in order to open or close the switches 17, 18. If appropriate, they may alternatively be provision for the switches 17, 18—without a control circuit—to be capable of being closed solely by applying suitable voltage levels to selected chip terminals for measuring the temperature.

When the function test of the chip 10 is being carried out, it is operated in accordance with the operating conditions in known test routines. The chip 10 is heated up in the process by the power loss that occurs during operation and, if appropriate, selected ambient temperatures are set for the chip 10. In order to be able to determine precisely the internal chip temperature that occurs in the process, a corresponding control signal is applied to the control circuit 19 during active operation. As a result, the current switch 17 and the voltage switches 18 are closed, causing the internal temperature measuring circuit to be connected to the two chip connection pairs 11, 12 and to the temperature measuring pins. The known constant current which is fed into the chip pins 11 from a constant current source 31 brings about, in the measuring diode 14, a voltage drop which is dependent on the measuring diode temperature. By use of the chip pins 12, the voltage drop is tapped off with high precision by a voltage measuring device 30 of the test configuration and the precise temperature value is determined from it. In this context, the semiconductor switches 17, 18 may also alternatively be implemented as metal options. The chip must then be suitably prepared for the temperature measurement. It is possible to dispense with the control circuit and the semiconductor switches. The metal switches are short-circuited for measuring purposes using, for example, focused iron beam technology, and the temperature measurement is carried out, as described above. However, if the semiconductor switches 17, 18 and the control circuit 19 are integrated onto the chip as in FIG. 4, there is a provision for the current switch 17 and the voltage switches 18 to be opened during normal operation, i.e. if no temperature measurement is to take place. As a result, the temperature measuring configuration is disconnected from the connection pairs 11, 12, and an address line 20 connected to the pin 11 and input/output lines 21 connected to the pins 12 can be used without any restriction. According to the invention, it is therefore possible without exception to use all the chip pins of the memory module 10 in a known fashion, it being, however, possible additionally to activate the temperature measurement configuration integrated onto the chip 10 or to connect to the corresponding chip terminals, and carry out a precise chip temperature measurement for test purposes.

Figure 5:
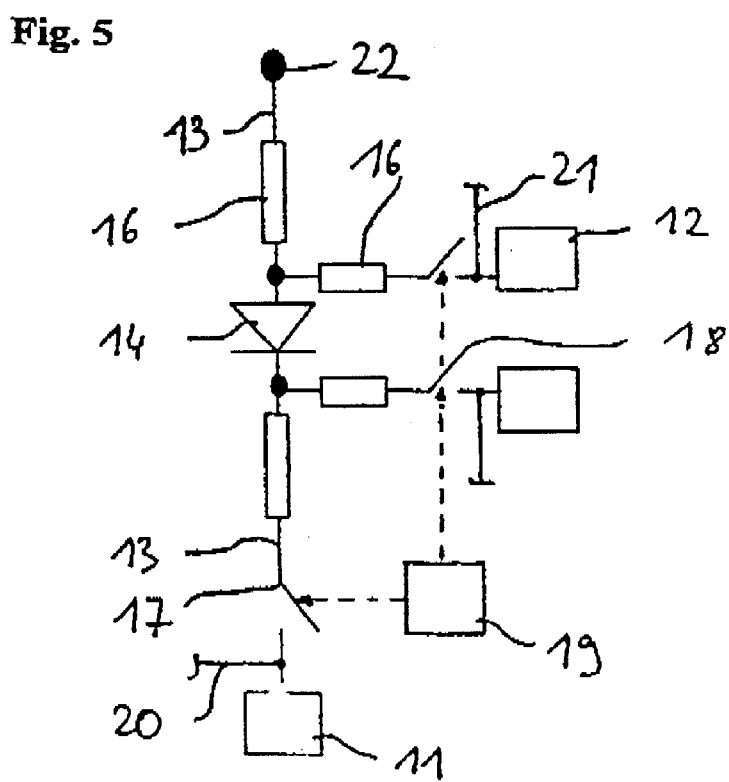
FIG. 5 is a circuit diagram of the temperature measuring configuration of the semiconductor chip according to a second exemplary embodiment of the invention.

FIG. 5 shows the circuit diagram of a slightly modified second exemplary embodiment of the temperature measuring configuration. Here, a chip-internal connection pad 22 is used as one of the current terminals 11, and a suitably placed low-impedance n-FET is used as the current switch 17.

We claim:

1. A method for determining a temperature of a semiconductor chip, which comprises the steps of:
   impressing a defined current onto selected chip terminals;
   measuring a voltage occurring at least partially at a semiconductor diode structure disposed between the selected chip terminals using four-conductor connection technology, the voltage being tapped off directly at the semiconductor diode structure;
   determining the temperature of the semiconductor chip by reference to the voltage and the defined current;
   closing switches integrated on the semiconductor chip during the measuring of the voltage step, the switches being disposed between the selected chip terminals and the semiconductor diode structure; and
   opening the switches after a temperature measurement has been terminated, for making the selected chip terminals available again for normal operation of the semiconductor chip.

2. The method according to claim 1, wherein the semiconductor chip is a memory chip.

3. A semiconductor chip, comprising:
   a housing;
   chip terminals extending from said housing;
   a temperature measuring diode structure having terminals disposed in said housing;
   two connecting lines each connected between one of said chip terminals and one of said terminals of said diode structure;
   two voltage measuring lines each connected between further ones of said chips terminals and said terminals of said diode structure, said connecting lines and said voltage measuring lines connected to said diode structure using four-conductor connection technology;
   a control circuit disposed in said housing; and
   a switch connected to and activated by said control circuit, said switch connected to at least one of said connecting lines and said voltage measuring line.

4. The semiconductor chip according to claim 3, wherein said chip terminals are at least one of address terminals, input terminals and output terminals.

5. The semiconductor chip according to claim 3, wherein the semiconductor chip is a memory chip.

* * * * *